US009800961B2

(12) United States Patent
Nicholson et al.

(10) Patent No.: US 9,800,961 B2
(45) Date of Patent: Oct. 24, 2017

(54) PORTABLE LOUDSPEAKER

(75) Inventors: Travis E. Nicholson, Pepperell, MA (US); Paul Warren, Auburn, MA (US); Stephen J. Maguire, Grafton, MA (US); Tommy Marincic, Boston, MA (US); Leslie L. Scott, Weston, MA (US)

(73) Assignee: Bose Corporation, Framingham, MA (US)

( * ) Notice: Subject to any disclaimer, the term of this patent is extended or adjusted under 35 U.S.C. 154(b) by 895 days.

(21) Appl. No.: 13/612,822

(22) Filed: Sep. 12, 2012

(65) Prior Publication Data
US 2013/0170684 A1    Jul. 4, 2013

Related U.S. Application Data

(63) Continuation-in-part of application No. 13/076,544, filed on Mar. 31, 2011.

(51) Int. Cl.
| | |
|---|---|
| *H04R 1/00* | (2006.01) |
| *H03G 3/34* | (2006.01) |
| *H04R 5/04* | (2006.01) |
| *H04R 1/28* | (2006.01) |

(52) U.S. Cl.
CPC .............. *H04R 1/00* (2013.01); *H03G 3/348* (2013.01); *H04R 5/04* (2013.01); *H04R 1/2834* (2013.01); *H04R 2420/07* (2013.01); *H04R 2499/11* (2013.01)

(58) Field of Classification Search
USPC .......... 381/87, 333, 334, 335; 181/148, 149, 181/198, 199
See application file for complete search history.

(56) References Cited

U.S. PATENT DOCUMENTS

| | | | | | |
|---|---|---|---|---|---|
| 5,621,804 | A | * | 4/1997 | Beppu ................ | H04R 1/2819 181/145 |
| 8,126,180 | B2 | * | 2/2012 | Jacob ..................... | H04R 1/26 381/332 |
| 2003/0008689 | A1 | * | 1/2003 | Uda ..................... | H04M 1/0214 455/569.2 |
| 2004/0102211 | A1 | * | 5/2004 | Ishida ................ | H04M 1/0214 455/550.1 |
| 2007/0076911 | A1 | * | 4/2007 | Schul ..................... | H04R 5/02 381/334 |
| 2012/0072752 | A1 | * | 3/2012 | Kennedy ............... | G06F 1/3206 713/323 |
| 2013/0032432 | A1 | * | 2/2013 | Slotta ..................... | H05K 5/02 181/199 |

* cited by examiner

*Primary Examiner* — Duc Nguyen
*Assistant Examiner* — Yogeshkumar Patel

(57) ABSTRACT

A portable loudspeaker includes an electro-acoustic driver which creates sound waves when operated and a housing having a front side to which the driver is secured. The loudspeaker also includes a battery supported by the housing for providing electrical power to the driver and a cover having an upper portion and a lower portion, and secured to the housing which can be moved between (i) a closed position in which the upper and lower portions overlie the driver, and (ii) an open position in which the upper and lower portions do not overlie the driver and are substantially disposed beneath a supporting base of the housing. A controller controls operation of the loudspeaker. When the cover is moved to the closed position, the controller mutes the driver if the driver was outputting acoustic waves when the cover was moved to the closed position.

14 Claims, 10 Drawing Sheets

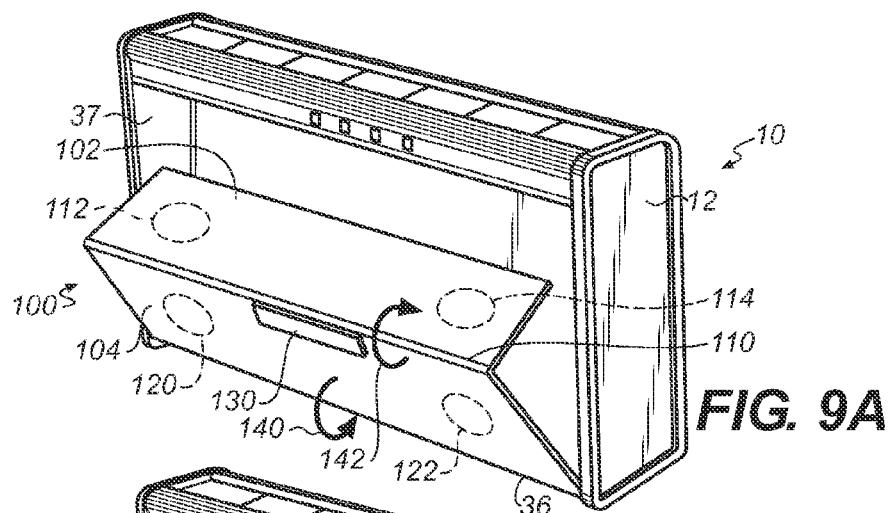
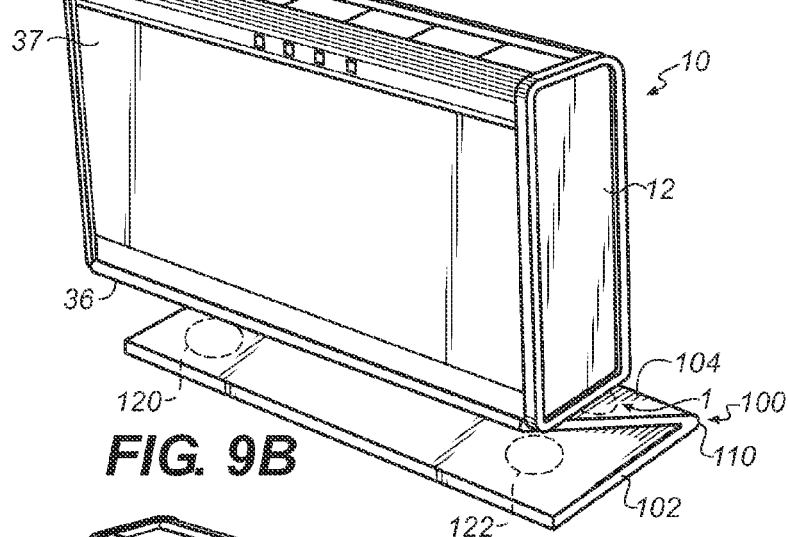
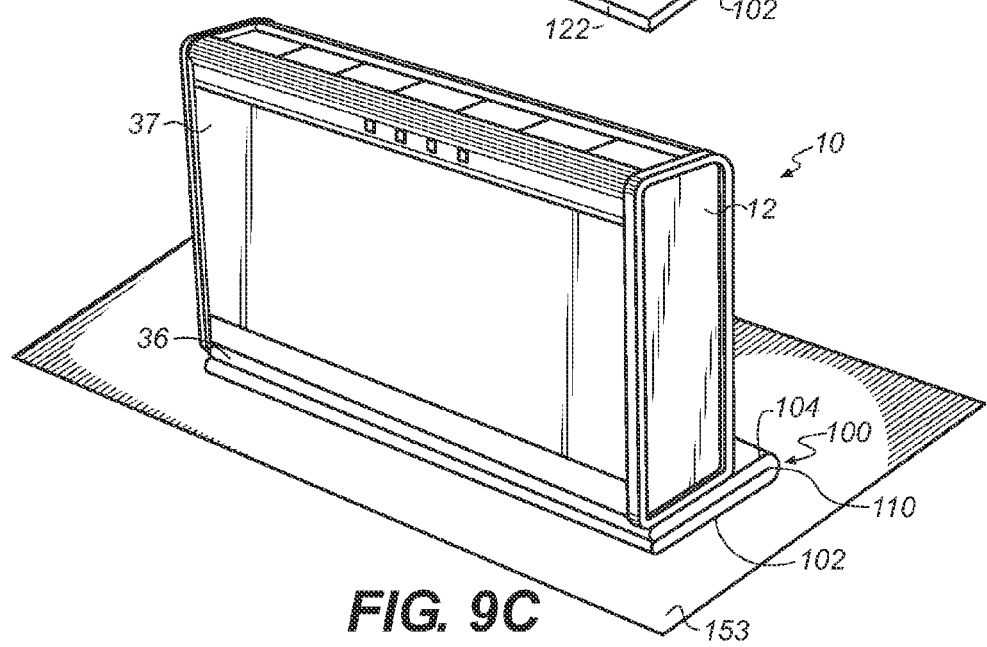

PORTABLE LOUDSPEAKER

CROSS-REFERENCE TO RELATED APPLICATION

The present application is a continuation-in-part of application Ser. No. 13/076,544, filed on Mar. 31, 2011, the entire disclosure of which is incorporated herein by reference.

BACKGROUND

This disclosure relates to audio devices and in particular to a portable loudspeaker including a cover.

U.S. Pat. No. 7,095,867 discloses a portable audio reproduction system capable of receiving audio signals from one or more sources and reproducing the signals via speakers contained therein. The speakers of the portable audio reproduction system can preferably be received within a base portion of the system, thereby protecting the speakers during transport and reducing the overall size of the system for improved portability. When a user opens the portable audio reproduction system (i.e. transforms the system from a closed state to an open state), the user preferably rotates speakers 160 and 165 approximately 285 degrees around hinge 180 until speakers 160 and 165 come to rest against a hinge stop. The portable audio reproduction system may automatically power off when closed. If a user of the this system closes it and then decides shortly thereafter that they want to continue to listen to audio, they will have to manually turn the system back on and wait for it to power up. This is inconvenient.

SUMMARY

In one aspect, a portable loudspeaker includes an electro-acoustic driver which creates sound waves when operated and a housing having a front side to which the driver is secured. The loudspeaker also includes a battery supported by the housing for providing electrical power to the driver and a cover secured to the housing which can be moved between (i) a closed position in which the cover overlies the driver, and (ii) an open position in which the cover does not overlie the driver. A controller controls operation of the loudspeaker. When the cover is moved to the closed position, a feature on the cover causes an indication to the controller that the cover is in the closed position. In response to the indication, the controller mutes the driver if the driver was outputting acoustic waves when the cover was moved to the closed position.

Embodiments may include one or more of the following features. The controller may be configured to mute the driver for a set time period. If the cover is moved away from the closed position during the set time period, the controller unmutes the driver. A receiver may be included for wirelessly receiving audio signals from an audio source device. An audio connection between the receiver and the audio source device is maintained during the set time period. If the cover remains in the closed position beyond the set time period, an audio connection between the receiver and the audio source device is severed. A first passive radiator secured to the housing may be included. The passive radiator may be located on the front side of the housing. A second passive radiator may be included that is located on a back side of the housing that is substantially opposite to the front side of the housing. The cover may overlie the passive radiator when the cover is in the closed position. The feature on the cover may comprises a magnet that radiates a magnetic field that is detected by a sensor in the housing when the cover is in the closed position.

In another aspect, a portable loudspeaker includes an electro-acoustic driver which creates sound waves when operated and a housing having a front side to which the driver is secured. A battery is supported by the housing for providing electrical power to the driver. A receiver is included for wirelessly receiving audio signals from an audio source device. A cover is secured to the housing which can be moved between (i) a closed position in which the cover overlies the driver, and (ii) an open position in which the cover does not overlie the driver. A controller controls operation of the loudspeaker. When the cover is moved to the closed position, a feature on the cover causes an indication to the controller that the cover is in the closed position. In response to the indication, an audio connection between the receiver and the audio source device is maintained for a set time period.

Embodiments may include one or more of the following features. If the cover remains in the closed position beyond the set time period, the audio connection between the receiver and the audio source device is severed. The controller mutes the driver if the driver was outputting acoustic waves when the cover was moved to the closed position. The controller can mute the driver for the set time period. If the cover is moved away from the closed position during the set time period, the controller unmutes the driver. A first passive radiator secured to the front side of the housing may be included. A second passive radiator may be included that is located on a back side of the housing that is substantially opposite to the front side of the housing. The cover may overlie the first passive radiator when the cover is in the closed position. One or more manually operable control surfaces may be included for controlling operation of the loudspeaker. The one or more control surfaces being inactivated when the cover remains in the closed position longer than the set time period.

In yet another aspect, a loudspeaker includes an electro-acoustic driver which creates sound waves when operated, and a passive radiator which can be energized from the sound waves. A housing is included to which the driver and passive radiator are secured. A battery is supported by the housing for providing electrical power to the driver. A receiver wirelessly receives audio signals from an audio source device. A cover is secured to the housing which can be moved between (i) a closed position in which the cover overlies the driver and passive radiator, and (ii) an open position in which the cover does not overlie the driver and passive radiator. A controller controls operation of the loudspeaker. When the cover is moved to the closed position, a feature on the cover causes an indication to the controller that the cover is in the closed position. In response to the indication, the controller (a) mutes the driver if the driver was outputting acoustic waves when the cover was moved to the closed position, and (b) maintains an audio connection between the receiver and the audio source device for a set time period.

BRIEF DESCRIPTION OF THE DRAWINGS

FIGS. 9A-9C are views of the portable loudspeaker of FIG. 8 with the attached cover located in various positions.

DETAILED DESCRIPTION

Figure 1:
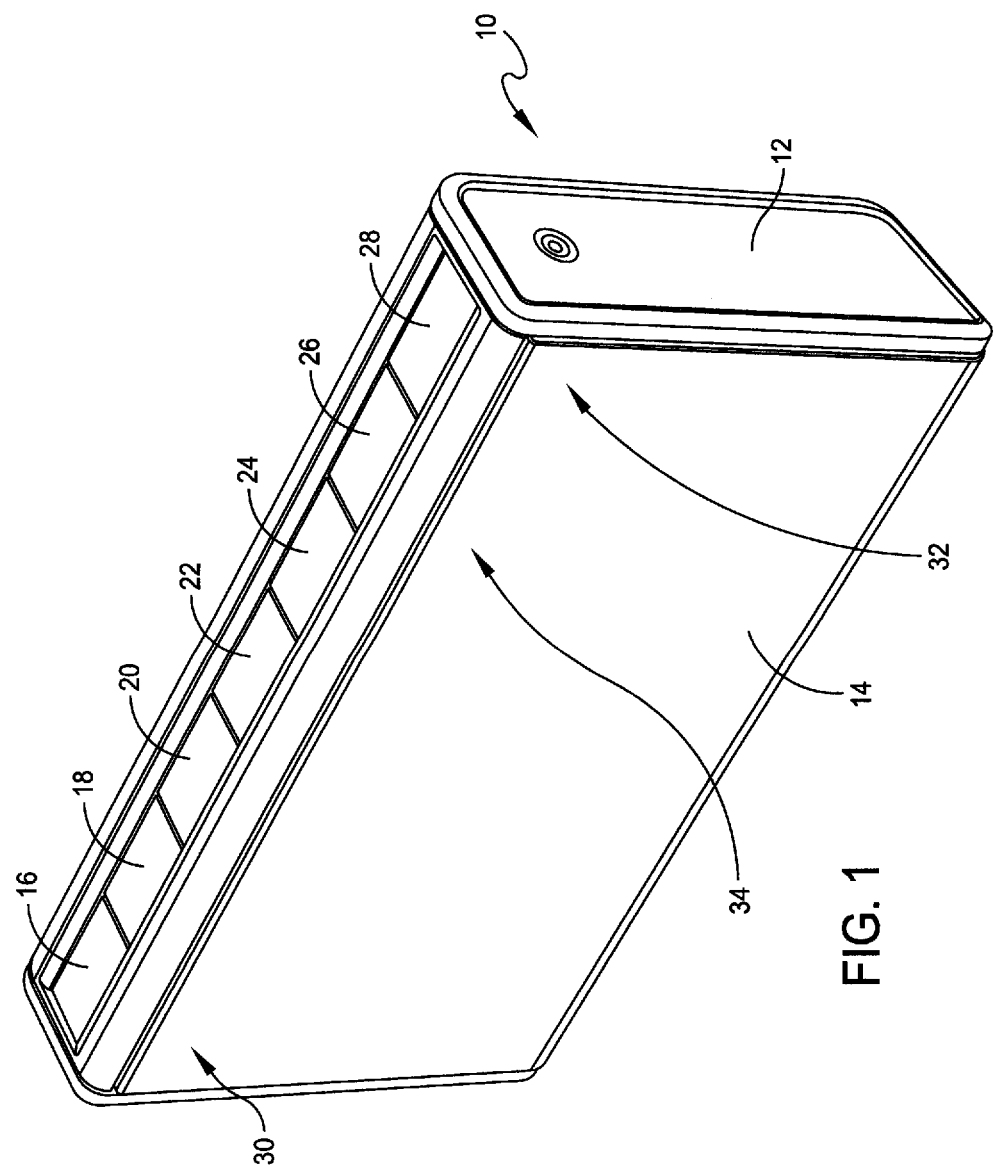
FIG. 1 is perspective view of a portable loudspeaker as seen from the front, top and right sides.

With reference to FIG. 1, a portable loudspeaker 10 includes a housing 12 and a cover 14 which is shown in a closed position. A "Power" button (or manually operable control surface) 16 is pressed to turn the loudspeaker 10 on or off. An "Aux" button 18 is pressed to select an auxiliary audio source (not shown) which can provide an audio signal to the loudspeaker 10 via a hardwired electrical connection. A "Bluetooth" button 20 is pressed to select a Bluetooth® audio source (not shown) which can provide an audio signal to the loudspeaker 10 via a wireless connection. Element 22 is actually a false button which cannot be pressed to provide any functionality. Element 22 is actually a Bluetooth® antennae and transceiver (combined transmitter and receiver, not shown). The transceiver can wirelessly receive audio signals from a Bluetooth® audio source device. A "Mute" button 24 can be pressed to mute or un-mute the loudspeaker 10. A "Vol−" button 26 is pressed to decrease the volume of the loudspeaker 10. A "Vol+" button 28 is pressed to increase the volume of the loudspeaker 10.

A pair of magnets (not shown) is located inside the cover 14 respectively at the upper corners of the cover (location identified by reference numerals 30 and 32). These two magnets interact with a steel speaker grill to hold the cover 14 in the closed position (described further below). Each of the two holding magnets are preferably multipole magnets. The multi-pole arrangement increases the holding force of each magnet while reducing the leakage field of each magnet. A feature on the cover in the form of a third magnet (not shown) is also located inside the cover 14 near the top edge of the cover (location identified by reference numeral 34). A magnetic field from the third magnet is detected by a Hall-effect sensor (not shown) inside the housing 12 (and preferably above the steel grill) which indicates to a controller of the loudspeaker that the cover 14 is in the closed position. The third magnet is preferably a single pole square magnet and should be located adjacent the Hall-effect sensor when the cover is in the closed position. The controller controls operation of the loudspeaker 10 and is discussed further below.

Figure 2:
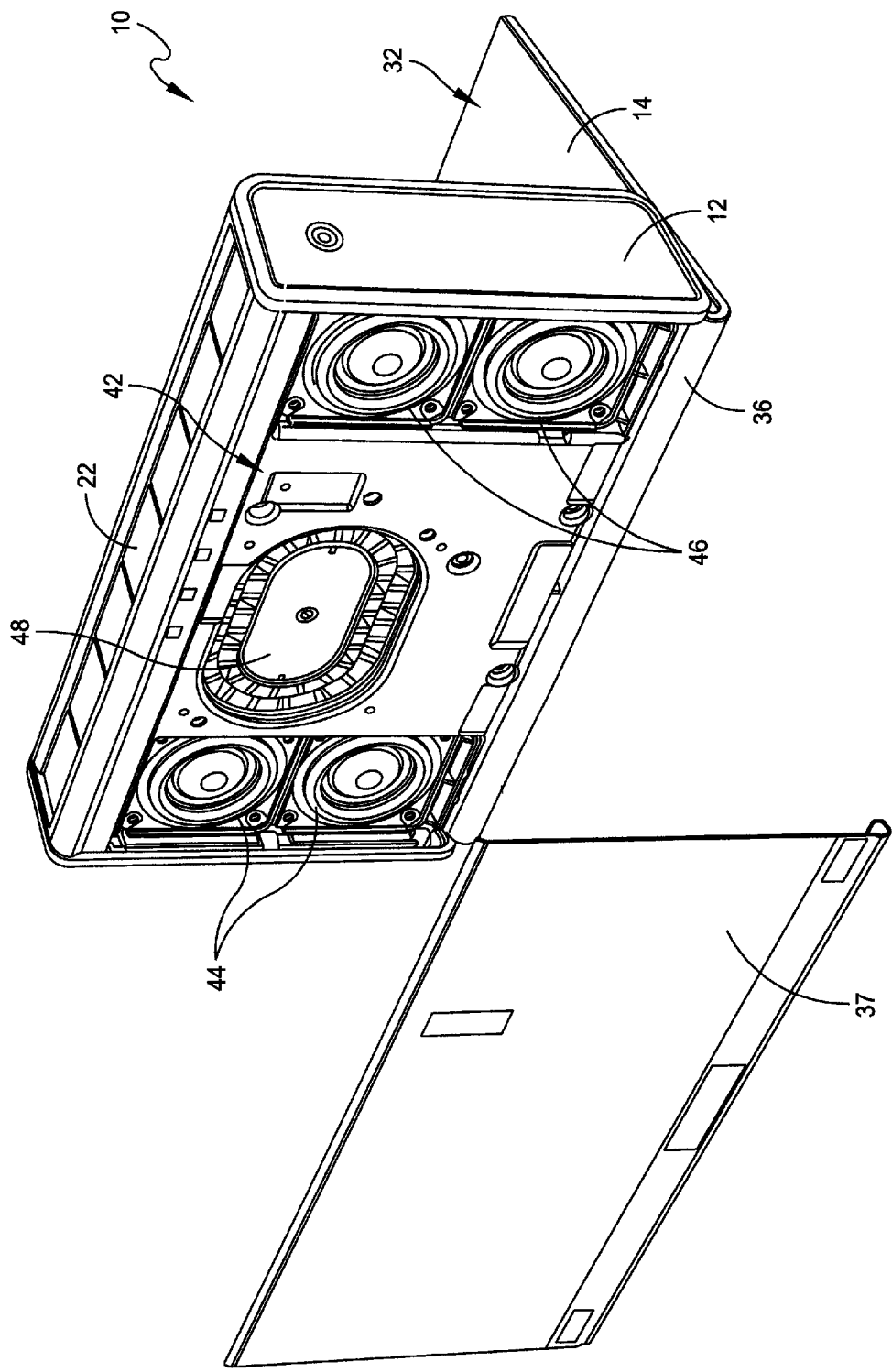
FIG. 2 is the same perspective view as in FIG. 1 with a cover rotated to an open position and a speaker grill exploded out from the loudspeaker.

Turning to FIG. 2, the cover 14 has been rotated (moved) about a lower hinge 36 from the closed position shown in FIG. 1 to an open position. The lower hinge 36 can be a living hinge in some implementations. A bottom portion of the cover 14 which extends from the lower hinge 36 is secured to a bottom of the housing 12 of the loudspeaker 10 by, for example, a pair of hex screws (not shown). The cover 14 rotates about 285 degrees between the closed and opened positions. When the cover 14 is in the opened position, it supports the loudspeaker 10 and provides resistance to the loudspeaker 10 tipping over.

A steel speaker grill 37, which is substantially acoustically transparent, has been exploded off of the loudspeaker 10 so that other features of the loudspeaker can be seen. The grill 37 interacts magnetically with the two magnets inside the top corners of the cover 14 to hold the cover 14 in the closed position (FIG. 1). Also as mentioned above, a Hall-effect sensor (not shown) is located inside the housing 12 at location 42. When the cover 14 is in the closed position, this sensor detects the magnetic field from the magnet inside the cover at the location 34 (FIG. 1) and indicates to a controller that the cover is closed.

The loudspeaker 10 has a left pair of electro-acoustic drivers 44 which are driven by a left channel audio signal. Also included are a right pair of electro-acoustic drivers 46 which are driven by a right channel audio signal. The drivers are all secured to the housing 12 and create sound waves when operated. A first passive radiator 48 is secured to the housing 12 and is located on a same side of the housing as the drivers 44 and 46. In one embodiment, the left pair of drivers 44 and right pair of drivers 46 are disposed on opposite ends of the housing 12, and the first passive radiator is positioned between the left and right pair of drivers 44, 46, respectively. When the cover 14 is in the closed position it overlies the drivers 44 and 46 as well as the passive radiator 48 (with the grill 37 in between). When the cover 14 is in the open position it does not overlie the drivers and passive radiator.

Figure 3:
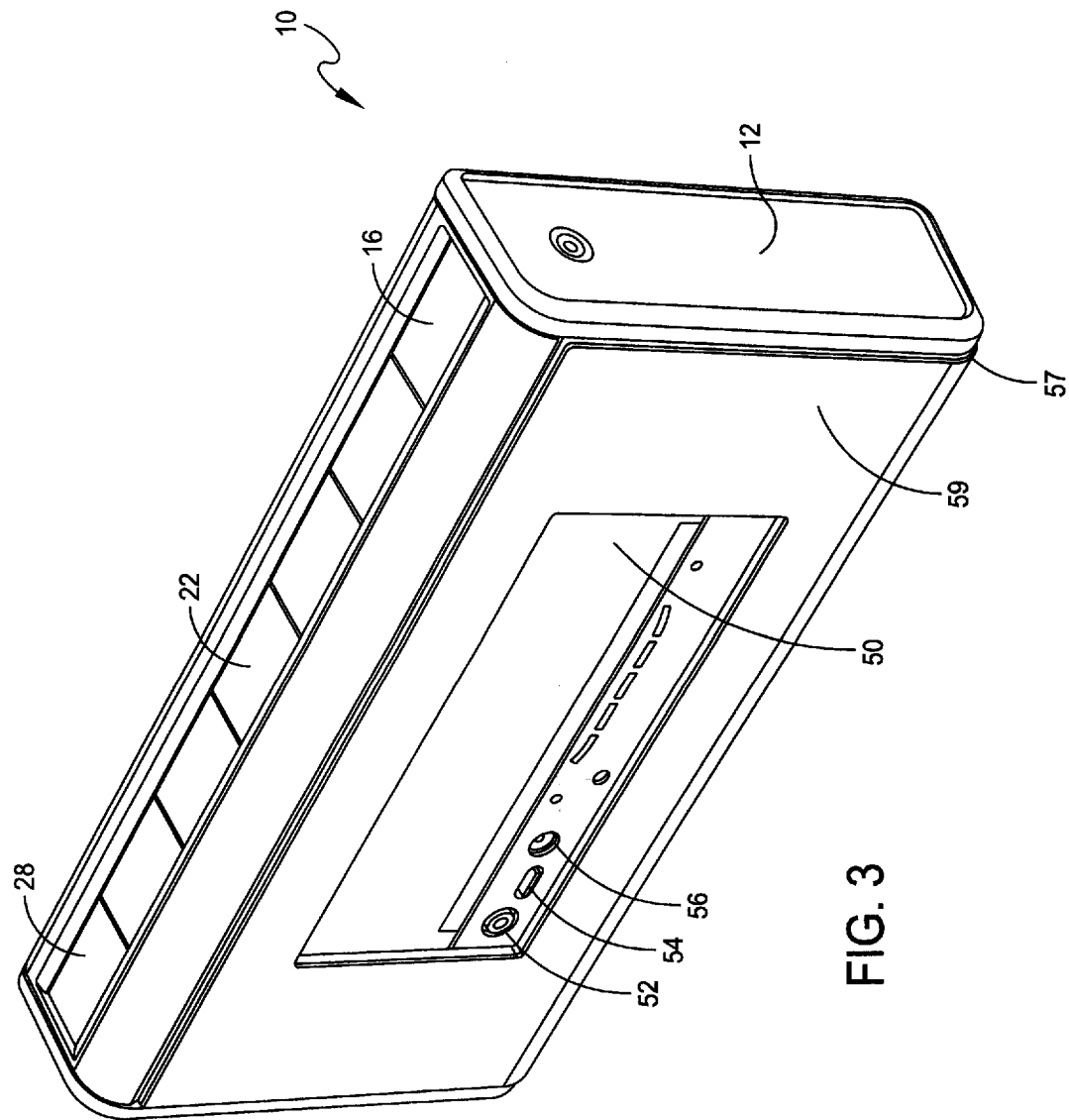
FIG. 3 is perspective view of the portable loudspeaker of FIG. 1 as seen from the back, top and left sides.

Referring now to FIG. 3, a back portion of the loudspeaker is shown. The front portion of the cover 14 (not visible in this view) is in its closed position. A back portion 59 of the cover extends via a living hinge 57 from the bottom portion of the cover and is secured to the back of the loudspeaker. A substantially acoustically transparent grill 50 covers a second passive radiator (not shown). The second passive radiator is substantially the same as the first passive radiator 48 and is located on a side of the housing 12 that is substantially opposite to the side of the housing 12 on which the first passive radiator 48 is located. The drivers 44 and 46 (FIG. 2) acoustically energize a substantially airtight acoustic volume inside the loudspeaker 10 which causes the first and second passive radiators to vibrate and emit sound waves. The loudspeaker 12 can also include an "Aux In" jack 52 which can be configured to accept a 3.5 mm mini-jack on the end of a hard-wired connection to an audio source device (not shown). As such, audio information from this audio source device can be provided to the loudspeaker 10 through jack 52. A service port 54 (e.g. a USB jack) is used to receive software updates over a hard-wired connection. A charging jack 56 accepts 17V DC over a hard-wired connection in order to charge a rechargeable battery (discussed below) that is secured to the housing 12.

Figure 4:
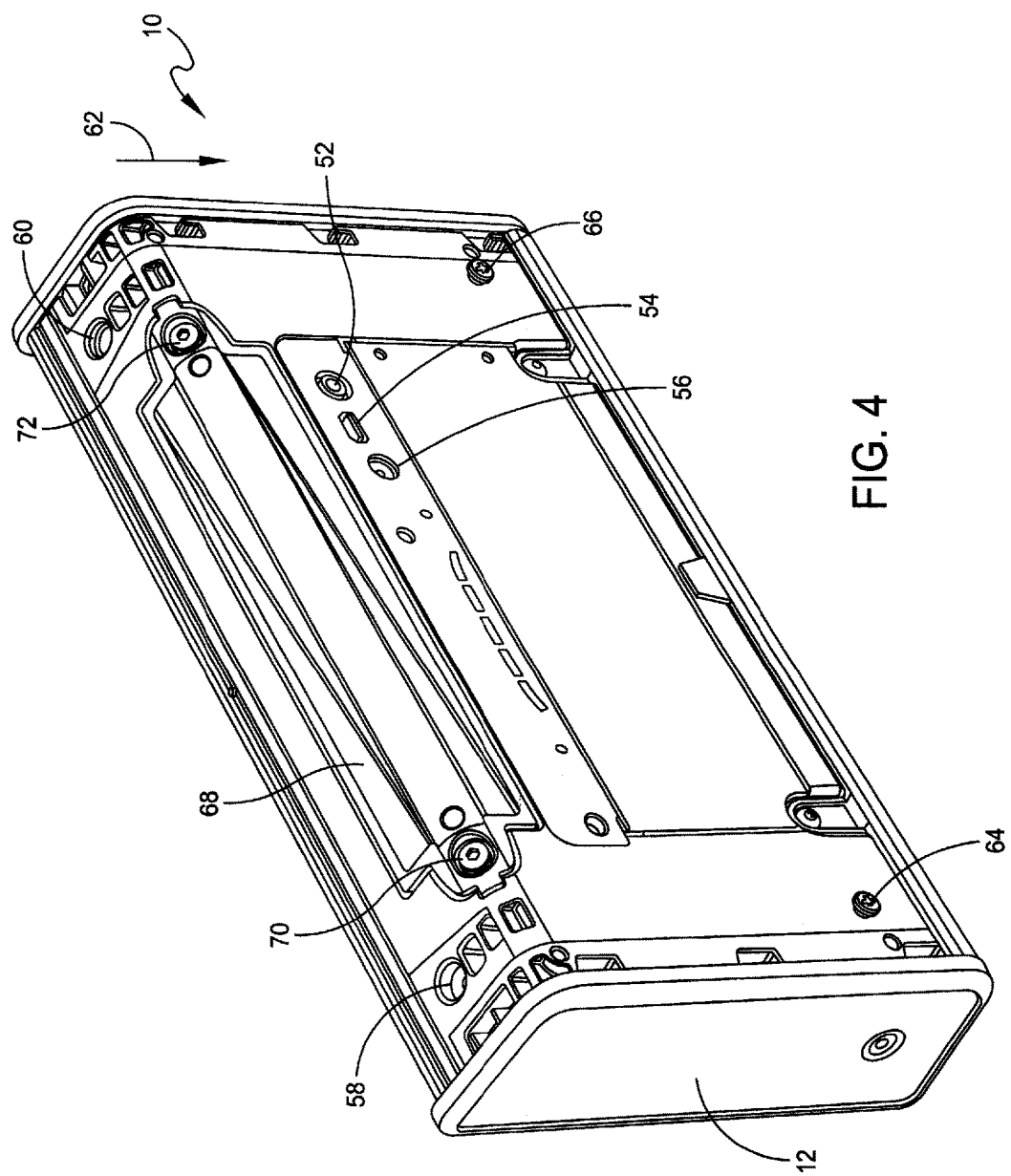
FIG. 4 is perspective view of the portable loudspeaker of FIG. 1 with the cover removed as seen from the back, bottom and right sides.

Turning to FIG. 4, the cover 14 (FIG. 1) has been removed from the loudspeaker 10 by first removing a pair of hex screws (not shown) from threaded holes 58 and 60. A back portion of the cover 59 (see FIG. 3) is then moved in the direction of an arrow 62. This allows a pair of blind openings on the inside of the back portion of the cover to be released from a respective pair of anchor screws 64 and 66. These blind openings each have a larger portion which can accept a head of one of the screws 64, 66, and a narrower portion which has a width about the same size as the diameter of the threaded portion of each screw 64, 66. A removable cover allows differently styled covers (e.g. leather, faux wood grain, etc.) to be used with the loudspeaker 10. A rechargeable battery module 68 is secured to and supported by the housing 12. The battery 68 provides electrical power to the loudspeaker including the drivers 44 and 46. The battery module 68 can be removed by loosening two hex screws 70 and 72 and then removing the battery.

Figure 5:
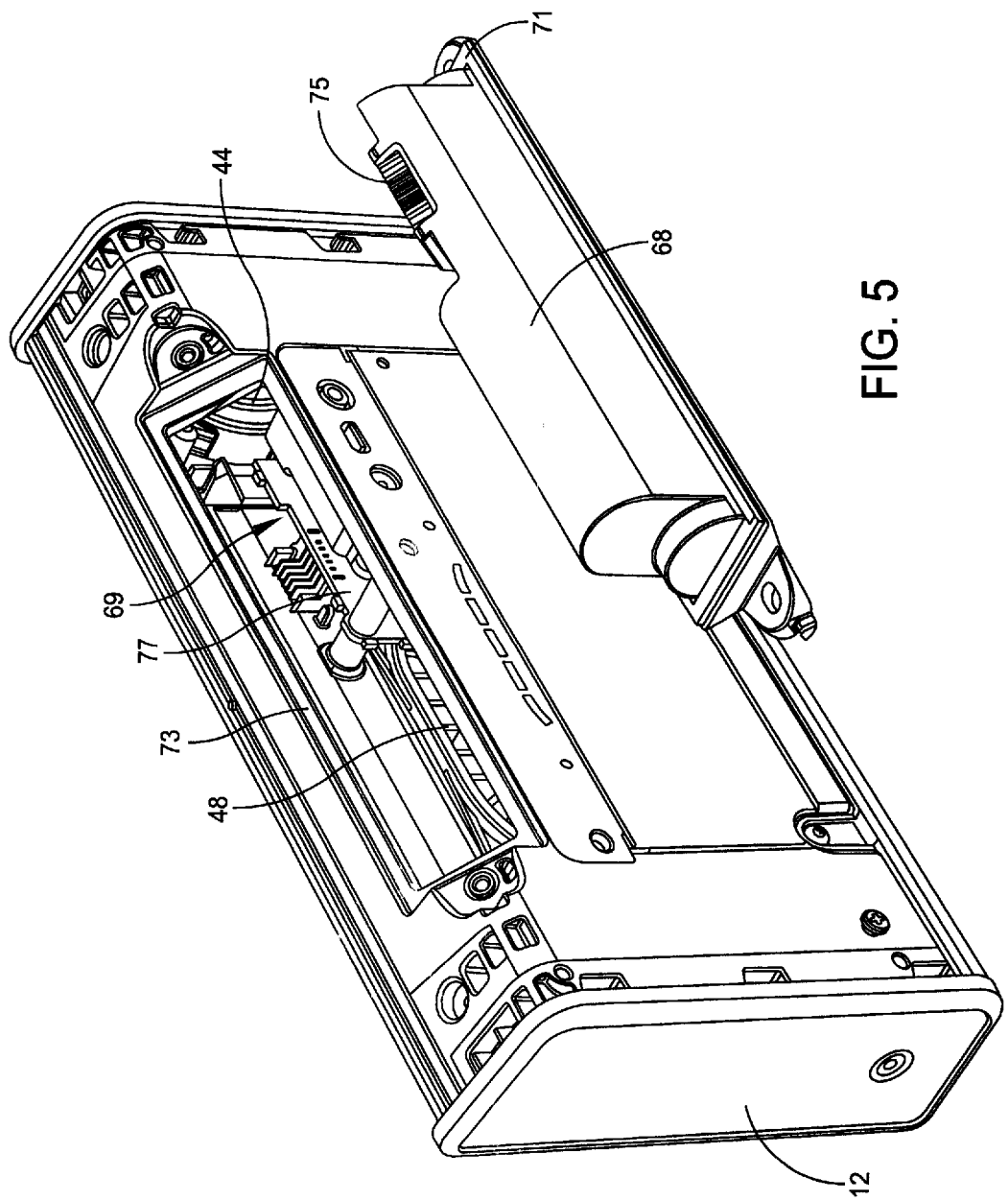
FIG. 5 is similar to FIG. 4 except that a battery module has been removed from the loudspeaker

Referring to FIG. 5, the battery module 68 has been removed from the housing 12 and rotated about 135 degrees about its long axis. An acoustic volume (mentioned above) 69 is visible inside the housing 12. Also visible inside the housing 12 are one of the electro-acoustic drivers 44 and the passive radiator 48. The battery module 68 includes a gasket 71 which extends around the entire battery module. When the battery module 68 is secured to the housing 12, the gasket 71 is compressed on a surface 73 of the housing 12. As such, the battery module completes the definition of and pneumatically seals the acoustic volume 69. Electrical contacts 75 on the battery module 68 engage with electrical contacts on a circuit board 77 inside the housing 12 when the battery module 68 is mounted to the housing 12.

Figure 6:
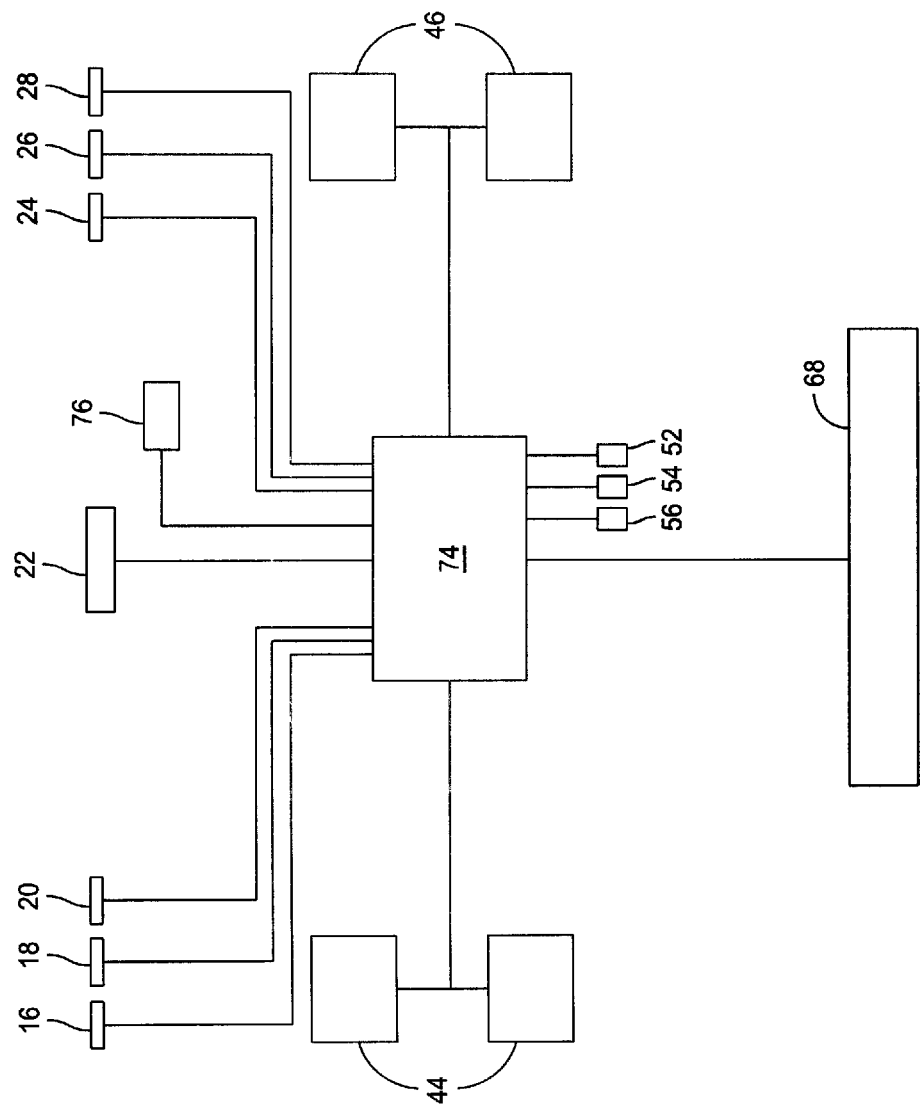
FIG. 6 is a block diagram of the operational portions of the loudspeaker of FIG. 1.

With reference to FIG. 6, a controller 74 (mentioned above) controls operation of the loudspeaker 10. Buttons 16, 18, 20, 24, 26 and 28 provide inputs to the controller 74 for the specific functions that each controls. The battery 68 provides electrical power to the controller 74. Wireless audio signals can be received by the Bluetooth® transceiver 22 and passed to the controller 74 in a digital form. The controller can also communicate back to a Bluetooth® audio source via the transceiver 22. The "Aux In" jack 52 can provide analog audio signals to the controller 74 from a different audio source that is temporarily hard wired to the jack 52. The controller digitizes these signals via an A/D convertor. The controller does some digital signal processing on the currently selected audio source and then converts the signal into an analog form via a D/A convertor. An amplifier (not shown) on the controller 74 amplifies the analog signal which is then passed on to the drivers 44 and 46 to create sound. The service port 54 is used to provide software updates to the controller 74. The charging jack 56 is used to electrically charge the battery 68 via the controller 74. The Hall-effect sensor 76 gives an indication to the controller when the sensor detects a magnetic field from the magnet in the cover at the location 34, thus indicating that the cover 14 is in the closed position.

Figure 7:
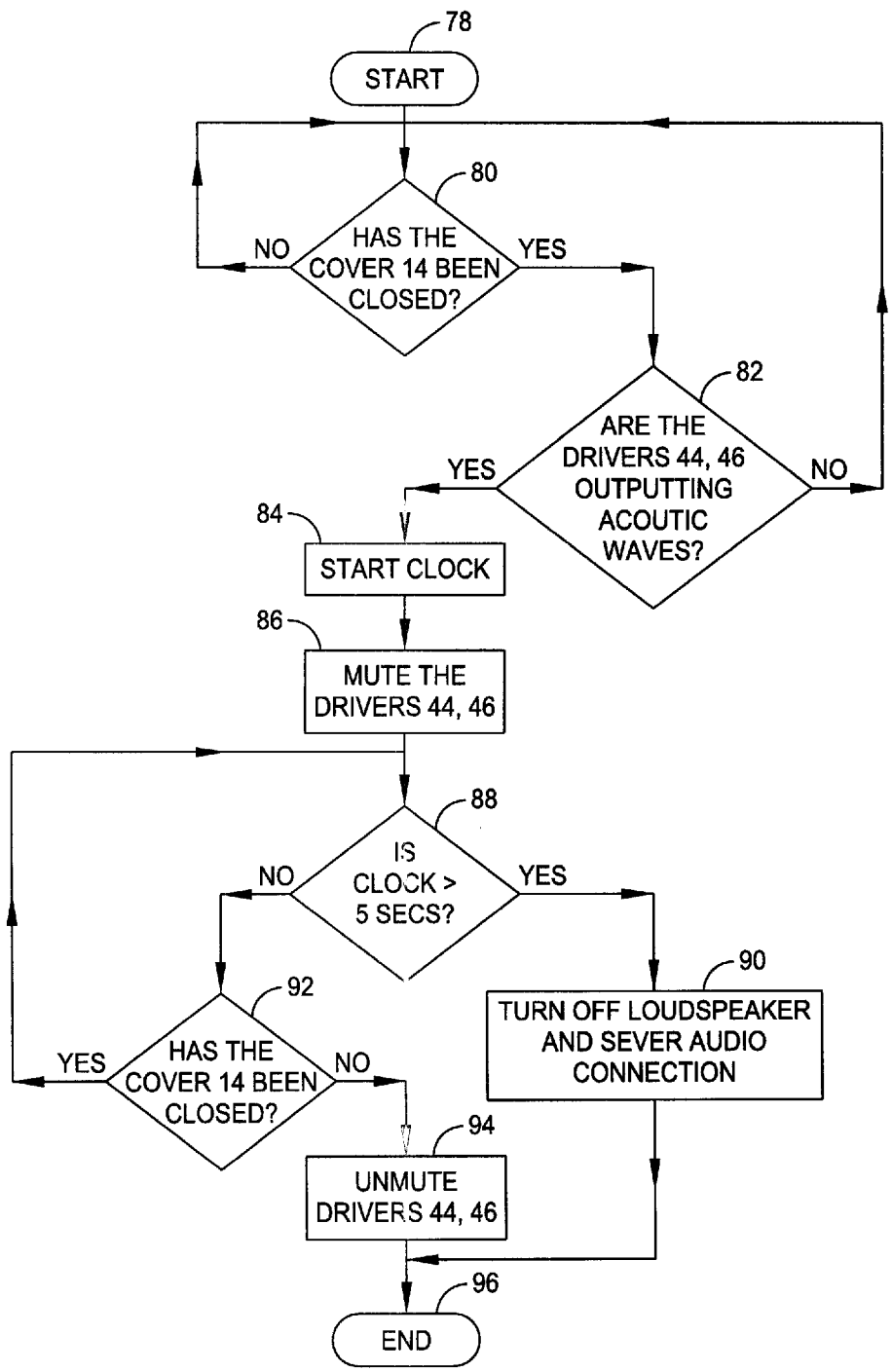
FIG. 7 is a high level diagram of a logic flow used by a controller in the loudspeaker of FIG. 1.

Turning to FIG. 7, logic flow will be described that is used by the controller 74 when the cover 14 is moved into its closed position. This subroutine commences at a "Start" step 78. At a step 80 it is determined if the cover 14 has been closed. As discussed above, the cover 14 is closed when the Hall-effect sensor 76 detects the magnetic field from the magnet inside the cover 14 at the location 34. If the cover 14 is closed, the logic then checks at a step 82 to see if the acoustic drivers 44 and 46 are outputting acoustic waves. The controller 74 can check this condition by seeing if the acoustic amplifier is outputting audio signals to the drivers 44 and 46. If this condition is satisfied, the logic then starts a clock at a step 84 and mutes the drivers 44 and 46 at a step 86. The muting of the drivers is done for up to a set time period (in one example, 5 seconds). It should be noted that any audio connection (wired or wireless) with an audio source device is maintained during this set time period.

The logic checks at a step 88 to see if the clock has exceeded 5 seconds. If this condition is met the logic proceeds to a step 90 where the loudspeaker is turned off and any audio connection with an audio source device (wired via the "Aux In" jack 52 or wirelessly via the transceiver 22) is severed. In addition, if the clock has exceeded 5 seconds the controller 74 can inactivate one or more of the buttons 16, 18, 20, 24, 26 and 28. For example, power button 16 can be inactivated to prevent the loudspeaker from being turned on with the cover 14 in the closed position (this might damage the drivers 44 and 46 as the sound pressure waves would be restricted from exiting the loudspeaker). If the clock is not greater than 5 seconds, the logic checks at a step 92 to see if the cover 14 is still closed. If this condition is satisfied, the logic returns to step 88. If at step 92 it is determined that the cover is not still closed (i.e. the cover 14 is moved away from the closed position), the logic unmutes the drivers 44 and 46 at a step 94. The logic ends at a step 96.

Figure 8:
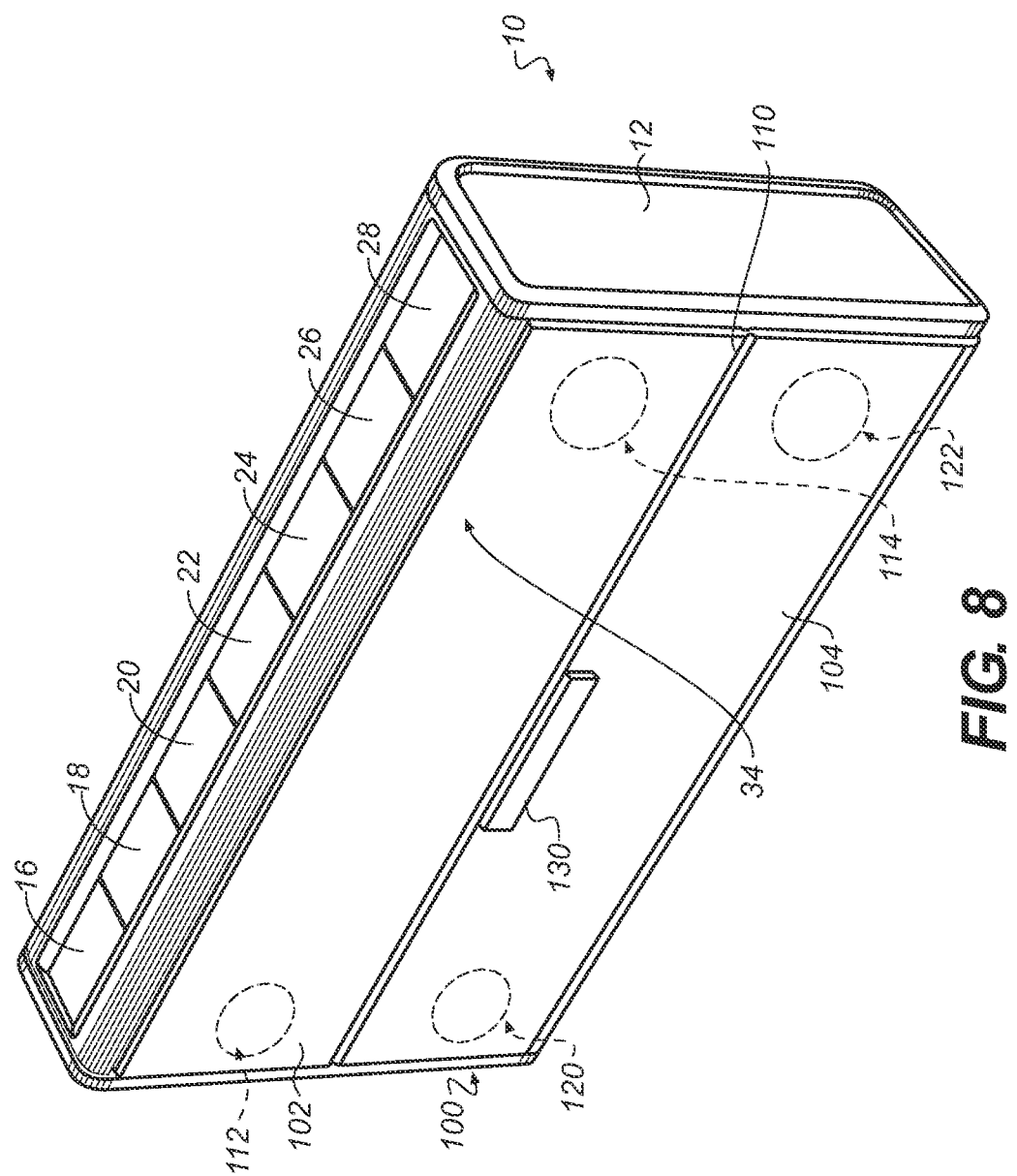
FIG. 8 is a perspective view of a further embodiment of the portable loudspeaker depicted in FIG. 1.

FIG. 8 depicts the loudspeaker 10 shown in FIG. 1 in a further embodiment including a cover 100 having an upper portion 102 and a lower portion 104. The upper portion 102 of the cover 100 is attached to the lower portion 104 of cover 100 along an upper hinge 110, which is a living hinge in one example. Although the cover 100 is shown in a bi-fold configuration with upper and lower portions, any number of portions can be implemented. A pair of upper magnets 112 and 114 (shown in dotted lines) and a pair of lower magnets 120 and 122 (shown in dotted lines) interact with the steel speaker grill 37 (FIG. 2) to hold the cover 100 in the closed position shown in FIG. 8. In some implementations, each of magnets 112, 114, 120, 122 are multi-pole magnets, such as four-pole neodymium magnets, for example. As described above, the multi-pole arrangement increases the holding force while reducing the leakage field of each magnet. Cover 100 can also include a handle or tab 130 to permit a user to open the cover by grasping the handle 130 to pull the cover away from the speaker grill 37 (FIG. 2). The handle 130 may be located along the hinge 110 as shown herein or located along a top portion of the upper portion 102 of the cover, for example. Other suitable locations for the handle 130 are contemplated.

Turning now to FIGS. 9A to 9C, the cover 100 of the loudspeaker 10 shown in FIG. 8 is shown in different positions from a partially closed position of FIG. 9A to a fully opened and stowed position of FIG. 9C. Referring again to FIG. 9A, the loudspeaker 10 is shown with the cover 100 separated from the grill 37 and rotated in a direction denoted by arrow 140 about the lower hinge 36 with the upper portion 102 of the cover 100 rotated about the upper hinge 110 with respect to the lower portion 104 of the cover 100 in a direction denoted by arrow 142. In FIG. 9B, cover 100 is further rotated about the lower hinge 36 in the direction 140 and the upper portion 102 is further rotated about the upper hinge 110 with respect to the lower portion 104 in the direction 142. FIG. 9C, shows the loudspeaker 10 with the cover 102 in a fully opened and stowed positioned with the lower portion 104 rotated approximately 285 degrees about the lower hinge 36 from its closed position shown in FIG. 8. The planes defining upper and lower portions 102, 104, respectively, being substantially parallel.

When the cover 102 is moved into the closed position shown in FIG. 8, the controller 74 of loudspeaker 10 operates in the same manner as previously described with respect to cover 14. While disposed in the closed position shown in FIG. 8, the cover 102 helps to protect the loudspeaker 10, and specifically the grill 37, such as during transport or storage of the loudspeaker 10, for example. In some embodiments, the upper magnets 112, 114 and the lower magnets 120, 122 help to maintain the upper portion 102 in contact with the lower portion 104 and the lower portion 104 in contact with the bottom of the housing 12 as shown in FIG. 9C.

Figure 10:
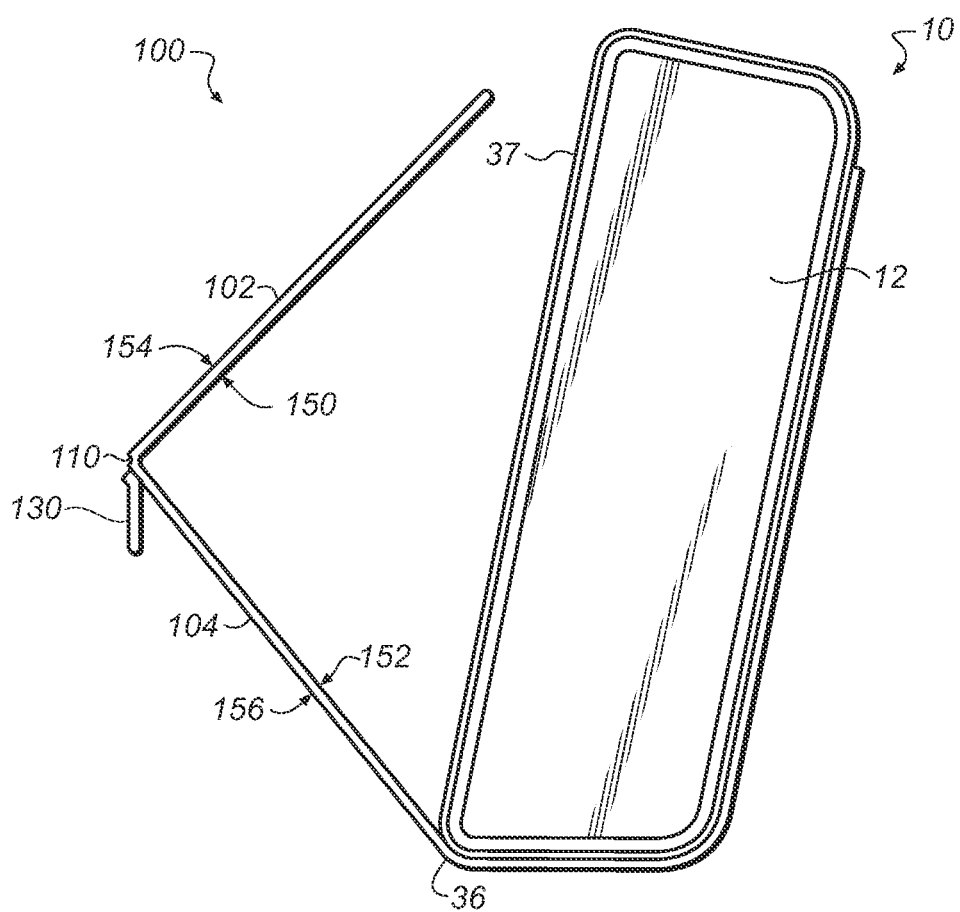
FIG. 10 is a side view of the portable loudspeaker of FIG. 9A.

FIG. 10 shows a side view of the loudspeaker 10 with the cover 100 rotated away from the grill 37 about the lower hinge 36 as generally shown in FIG. 9A. When the upper and lower portions 102, 104, respectively, of the cover 100 are brought together in the fully opened position shown in FIG. 9C, an inside surface 150 of the upper portion 102 meets an inside surface 152 of lower portion 104. When the loudspeaker is placed atop a supporting surface 153 (FIG. 9C) such as a table or countertop, an outside surface 154 of the upper portion 102 comes in contact with the supporting surface 153. An outside surface 156 of the lower portion 104 comes in contact with a bottom of the housing 12. With the implementation of the cover 100 shown in FIGS. 8, 9A-9C, and 10, the inside surfaces 150, 152 of the cover will not directly contact the supporting surface 153 of the loudspeaker 10 when the cover is the open position shown in FIG. 9C and placed atop the surface. Accordingly, should the supporting surface 153 atop which the loudspeaker is placed contain debris or other unwanted materials, only the outside surface 154 of the cover 100 will contact the supporting surface 153, and the inside surfaces 150 and 152 will remain separated from the surface 153 and facing one another as shown in FIG. 9C. Once the cover 100 is returned to the closed position shown in FIG. 8, only those protected inside surfaces 150 and 152 are brought into direct contact with the grill 37. Moreover, with a bi-fold configuration of cover 100, the area occupied by the loudspeaker 10 shown in FIG. 9C atop the supporting surface 153 is substantially less the area occupied by the loudspeaker 10 shown in FIG. 2. In some implementations, with similarly sized upper and lower portions 102, 104, respectively, of the cover 100, the area occupied by the loudspeaker 10 shown in FIG. 9C is approximately half the area occupied by the loudspeaker 10 shown in FIG. 2. Cover 100 takes up less space in the fully opened position of FIG. 9C, yet still unfolds to completely protect the grill 37.

As described above and in some implementations, the upper magnets 112, 114 and the lower magnets 120, 122 help to maintain the upper portion 102 in contact with the lower portion 104 and the lower portion 104 in contact with the bottom of the housing 12 as shown in FIG. 9C. This permits a user to transport the loudspeaker 10 in the open position shown in FIG. 9C while maintaining the cover 100 in a compact, stowed state. This implementation facilitate easier transport without requiring the user to hold any portion of the cover 100 or requiring the user to close the cover 100 and thereby muting the drivers 44 and 46 (FIG. 2) and interrupting the output and enjoying of audio (as described above with respect to FIG. 7) during transport of the loudspeaker 10.

A number of implementations have been described. Nevertheless, it will be understood that additional modifications may be made without departing from the spirit and scope of the inventive concepts described herein, and, accordingly, other embodiments are within the scope of the following claims.

What is claimed is:
1. A portable loudspeaker, comprising:
an electro-acoustic driver which creates sound waves when operated;
a housing having a front side to which the driver is secured;
a battery supported by the housing for providing electrical power to the driver;
a cover secured to the housing and comprising an upper portion and a lower portion, the cover being configured to move between (i) a closed position in which the upper and lower portions overlie the driver, and (ii) an open position in which the upper and lower portions do not overlie the driver and are substantially disposed under the supporting base;
a controller for controlling operation of the loudspeaker, wherein when the cover is moved to the closed position a feature on the cover causes an indication to the controller that the cover is in the closed position, and wherein in response to said indication, the controller mutes the driver if the driver was outputting acoustic waves when the cover was moved to the closed position; and
wherein the controller is configured to mute the driver for a set time period.
2. The loudspeaker of claim 1,
wherein if the cover is moved away from the closed position during the set time period, the controller unmutes the driver.
3. The loudspeaker of claim 1, further including
a receiver for wirelessly receiving audio signals from an audio source device, wherein an audio connection between the receiver and the audio source device is maintained during the set time period.
4. The loudspeaker of claim 1, further including
a receiver for wirelessly receiving audio signals from an audio source device, wherein if the cover remains in the closed position beyond the set time period, an audio connection between the receiver and the audio source device is severed.
5. A portable loudspeaker, comprising:
an electro-acoustic driver which creates sound waves when operated;
a housing having a front side to which the driver is secured and a supporting base;
a battery supported by the housing for providing electrical power to the driver;
a receiver for wirelessly receiving audio signals from an audio source device;
a cover secured to the housing and comprising an upper portion and a lower portion, the cover being configured to move between (i) a closed position in which the upper and lower portions overlie the driver, and (ii) an open position in which the upper and lower portions do not overlie the driver and are substantially disposed under the supporting base; and
a controller for controlling operation of the loudspeaker, wherein when the cover is moved to the closed position a feature on the cover causes an indication to the controller that the cover is in the closed position, and wherein in response to said indication an audio connection between the receiver and the audio source device is maintained for a set time period.
6. The loudspeaker of claim 5,
wherein if the cover remains in the closed position beyond the set time period, the audio connection between the receiver and the audio source device is severed.
7. The loudspeaker of claim 5,
wherein the controller mutes the driver if the driver was outputting acoustic waves when the cover was moved to the closed position.
8. The loudspeaker of claim 7,
wherein the controller mutes the driver for the set time period.
9. The loudspeaker of claim 7,
wherein if the cover is moved away from the closed position during the set time period, the controller unmutes the driver.

10. The loudspeaker of claim 5, further including
a first passive radiator secured to the front side of the housing.

11. The loudspeaker of claim 10, further including
a second passive radiator, the second passive radiator being located on a back side of the housing that is substantially opposite to the front side of the housing.

12. The loudspeaker of claim 10,
wherein the cover overlies the first passive radiator when the cover is in the closed position.

13. The loudspeaker of claim 5, further including
one or more manually operable control surfaces for controlling operation of the loudspeaker, the one or more control surfaces being inactivated when the cover remains in the closed position longer than the set time period.

14. A loudspeaker, comprising:
an electro-acoustic driver which creates sound waves when operated;
a passive radiator which can be energized from the sound waves;
a housing to which the driver and passive radiator are secured, the housing comprising a supporting base;
a battery supported by the housing for providing electrical power to the driver;
a receiver for wirelessly receiving audio signals from an audio source device;
a cover secured to the housing and comprising an upper portion and a lower portion, the cover being configured to move between (i) a closed position in which the upper and lower portions overlie the driver and passive radiator, and (ii) an open position in which the upper and lower portions do not overlie the driver and passive radiator and are substantially disposed under the supporting base; and
a controller for controlling operation of the loudspeaker, wherein when the cover is moved to the closed position a feature on the cover causes an indication to the controller that the cover is in the closed position, and wherein in response to said indication, the controller (a) mutes the driver if the driver was outputting acoustic waves when the cover was moved to the closed position; and (b) maintains an audio connection between the receiver and the audio source device for a set time period.

\* \* \* \* \*